US012297538B2

(12) United States Patent
Wang et al.

(10) Patent No.: US 12,297,538 B2
(45) Date of Patent: May 13, 2025

(54) HIGH REGISTRATION PARTICLES-TRANSFERRING SYSTEM

(71) Applicant: Xerox Corporation, Norwalk, CT (US)

(72) Inventors: Yunda Wang, Milpitas, CA (US); Sourobh Raychaudhuri, Mountain View, CA (US); JengPing Lu, Fremont, CA (US); Eugene M. Chow, Palo Alto, CA (US); Julie A. Bert, East Palo Alto, CA (US); David Biegelsen, Portola Valley, CA (US); George A. Gibson, Fairport, NY (US); Jamie Kalb, Mountain View, CA (US)

(73) Assignee: Xerox Corporation, Norwalk, CT (US)

( * ) Notice: Subject to any disclaimer, the term of this patent is extended or adjusted under 35 U.S.C. 154(b) by 75 days.

(21) Appl. No.: 18/221,302

(22) Filed: Jul. 12, 2023

(65) Prior Publication Data

US 2023/0366093 A1 Nov. 16, 2023

Related U.S. Application Data

(60) Continuation of application No. 16/781,813, filed on Feb. 4, 2020, now Pat. No. 11,732,362, which is a
(Continued)

(51) Int. Cl.
*H01L 21/67* (2006.01)
*B05B 5/00* (2006.01)
(Continued)

(52) U.S. Cl.
CPC ............... *C23C 16/50* (2013.01); *B05B 5/00* (2013.01); *B05D 1/00* (2013.01); *B81B 3/0018* (2013.01);
(Continued)

(58) Field of Classification Search
CPC ........... C23C 16/50; B05B 5/00; H01L 24/75; H01L 24/95; H01L 2224/95101;
(Continued)

(56) References Cited

U.S. PATENT DOCUMENTS 6,012,337 A 1/2000 Hodge
6,364,089 B1 * 4/2002 Singh ................ H01L 21/67132
198/408
(Continued)

FOREIGN PATENT DOCUMENTS

EP 1902923 A2 3/2008
EP 2817604 A2 12/2014
WO 2016027072 A1 2/2016

OTHER PUBLICATIONS

Extended European Search Report mailed Sep. 3, 2018 for European Patent Application No. 18165276.9.
(Continued)

*Primary Examiner* — Donghai D Nguyen
(74) *Attorney, Agent, or Firm* — Womble Bond Dickinson (US) LLP

(57) ABSTRACT

Disclosed herein are techniques for transferring particles in a pattern. In one implementation, a particle-transferring system includes a first substrate comprising a first surface configured to support a plurality of particles in a non-uniform pattern, and a particle transfer unit configured to remove the plurality of particles from the first surface in response to the plurality of particles being within a first gap. The system also includes a second substrate configured to remove the plurality of particles from the particle transfer unit and secure the plurality of particles to the second surface in response to the plurality of particles being within a second gap. The particle transfer unit is configured to transfer the plurality of particles and maintain the non-
(Continued)

uniform pattern regardless of the positions of the plurality of particles, which are not predefined to fit features of the particle transfer unit.

9 Claims, 10 Drawing Sheets

Related U.S. Application Data division of application No. 15/591,959, filed on May 10, 2017, now Pat. No. 10,604,843.

(51) Int. Cl.
 *B05D 1/00* (2006.01)
 *B81B 3/00* (2006.01)
 *C23C 16/50* (2006.01)
 *H01L 23/00* (2006.01)

(52) U.S. Cl.
 CPC .. *H01L 21/67271* (2013.01); *H01L 21/67282* (2013.01); *H01L 21/67294* (2013.01); *H01L 24/75* (2013.01); *H01L 24/95* (2013.01); *H01L 2224/95001* (2013.01); *H01L 2224/95101* (2013.01); *H01L 2224/95115* (2013.01); *H01L 2224/95144* (2013.01); *H01L 2224/95145* (2013.01); *H01L 2924/10253* (2013.01); *H01L 2924/1434* (2013.01); *H01L 2924/1461* (2013.01)

(58) Field of Classification Search
 CPC . H01L 2224/95115; H01L 2224/95144; H01L 2224/95145

See application file for complete search history.

(56) References Cited

U.S. PATENT DOCUMENTS

| | | | |
|---|---|---|---|
| 7,332,361 | B2 | 2/2008 | Lu et al. |
| 7,861,405 | B2 | 1/2011 | Chow et al. |
| 8,181,336 | B2 | 5/2012 | Chow et al. |
| 8,312,619 | B2 | 11/2012 | Chow et al. |
| 9,639,050 | B2* | 5/2017 | Veres .................. B41C 1/1008 |
| 2002/0099359 | A1 | 7/2002 | Santini |
| 2006/0128057 | A1 | 6/2006 | Lu |
| 2011/0012980 | A1 | 1/2011 | Stowe et al. |
| 2012/0321793 | A1* | 12/2012 | Lundvall .......... B29D 11/00288 427/256 |
| 2013/0130416 | A1 | 5/2013 | Bibl |
| 2014/0158415 | A1 | 6/2014 | Golda et al. |
| 2014/0259633 | A1 | 9/2014 | Okandan |
| 2017/0205734 | A1 | 7/2017 | Raychaudhuri et al. |
| 2019/0300289 | A1 | 10/2019 | Cok |

OTHER PUBLICATIONS

Qiushi et al., "Composite Railway Health monitoring System Based on Fiber Optic Bragg Grating sensing array", 2014 IEEE Far East Forum on Nondestructive Evaluation/Testing, IEEE, Jun. 20, 2014, pp. 259-264.

* cited by examiner

HIGH REGISTRATION PARTICLES-TRANSFERRING SYSTEM

RELATED APPLICATIONS

The present application is a continuation of Ser. No. 16/781,813 filed Feb. 4, 2020, titled, HIGH REGISTRATION PARTICLES-TRANSFERRING SYSTEM, which is a divisional of U.S. patent application Ser. No. 15/591,959, filed May 10, 2017, titled HIGH REGISTRATION PARTICLES-TRANSFERRING SYSTEM. The entire contents of each of the above-identified applications are incorporated by reference herein.

STATEMENT REGARDING FEDERALLY SPONSORED RESEARCH AND DEVELOPMENT

This invention was made with Government support under Contract No. DE-AR0000631 Micro Chiplet Printer for MOSIAC awarded by the Advanced Research Projects Agency-Energy (ARPA-E) and under Contract No. FA8650-15-7544 DARPA-A2P-Assembler awarded by the Defense Advanced Research Projects Agency (DARPA). The Government has certain rights in this invention.

TECHNICAL FIELD

The presently disclosed implementations are directed to a particles-transferring system, and, more particularly, to a high registration particles-transferring system.

BACKGROUND

Transfer systems transfer particles to form a functional assembly. The transfer system may include an assembly substrate and a final substrate. The particles may be an assembled object on the assembly substrate. The particles may be in a liquid environment. A transfer system may remove the assembled object from the assembly substrate and place the assembled object on a final substrate. Transferring of the particles may damage, impact, or contaminate one or more of the particles, the assembled object, or the transfer system. Transferring of particles may take a long time and may disrupt the pattern of the particles in the assembled object.

SUMMARY

The following presents a simplified summary of various aspects of the present disclosure in order to provide a basic understanding of such aspects. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to some aspects of the present disclosure, there is provided a particles-transferring system comprising: a first substrate comprising a first surface to support a plurality of particles in a pattern; a particle transferring unit comprising an outer surface to be offset from the first surface by a first gap, wherein the particle transferring unit is to remove the plurality of particles from the first surface in response to the plurality of particles being within the first gap, wherein the particle transferring unit is to secure the plurality of particles in the pattern to the outer surface and is to transport the plurality of particles in the pattern; and a second substrate comprising a second surface to be offset from the outer surface by a second gap, wherein the second substrate is to remove the plurality of particles in the pattern from the particle transferring unit in response to the plurality of particles being within the second gap, wherein the plurality of particles are to be secured in the pattern to the second surface.

In certain implementations, the first substrate is to support the plurality of particles in a liquid; the plurality of particles have an electric charge; the particle transferring unit is to generate an electric field; and the particle transferring unit is to remove the plurality of particles from the liquid and secure the plurality of particles via an electrical force.

In certain implementations, the particle transferring unit comprises a flexible substrate coupled to a roller; the plurality of particles are moved towards the particle transferring unit; the plurality of particles comprises a plurality of rows of particles; a row of the plurality of rows is removed from the first substrate and secured to the particle transferring unit in response to the row being within the first gap; and the first substrate, the second substrate, and an axis of the roller are parallel.

In certain implementations, the second surface comprises a tacky surface comprising one or more of adhesive, photoresist, polymers, silicon, or polydimethylsiloxane; and the second substrate is to remove the plurality of particles from the particle transferring unit and secure the plurality of particles to the second surface in response to the plurality of particles contacting the tacky surface.

In certain implementations, the plurality of particles are one or more of particles, chiplets, functional devices, microscale feedstock, or biomaterials; and the plurality of particles are to form a functional assembly.

In certain implementations, the particles-transferring system is to generate one or more of an optical metamaterial, cyborg tissue, an electronic therapeutic device, or a hierarchical mechanical structure.

In certain implementations, the particles-transferring system includes one or more spacers to provide the first gap.

In certain implementations, the one or more spacers are pre-manufactured to the first substrate or the particle transferring unit.

In certain implementations, the first substrate is an assembly substrate; the plurality of particles are an assembled object comprising a plurality of rows; the second substrate is a final substrate; the particle transferring unit is to transfer the assembled object by, for each of the plurality of rows, removing a row of the plurality of rows from the assembly substrate and transferring the row to the final substrate; and the particle transferring unit is to maintain particle registration of each of the plurality of particles.

In certain implementations, at least one of the first surface or the second surface is a curved surface.

According to other aspects of the present disclosure, there is provided a particle transferring unit comprising: a substrate; a first electrode on the substrate; a dielectric layer on the first electrode; and a second electrode on the dielectric layer, wherein the first electrode and the second electrode are to form an electric field to remove a plurality of particles in a pattern from a first substrate, secure the plurality of particles in the pattern to the particle transferring unit, and transfer the plurality of particles in the pattern to a second substrate.

In certain implementations, the first electrode is a continuous layer; the second electrode comprises a grid pattern comprising a first electrode grid and a second electrode grid; the first electrode grid is to be powered independently from the second electrode grid to modulate the electric field locally; and the electric field creates an electric force to remove the plurality of particles from the first substrate and secure the plurality of particles on the particle transferring unit.

In certain implementations, the particle transferring unit further comprises a plurality of integrated photosensitive switches to power the particle transferring unit optically.

In certain implementations, the substrate is flexible and coupled to one or more rollers; and the substrate is rotated over the rollers to remove and transport the plurality of particles.

In certain implementations, the substrate is coupled to one or more flexible joints; the substrate is positioned, by the one or more flexible joints, on the first substrate to remove the plurality of particles from the first substrate; and the substrate is positioned, by the one or more flexible joints, on the second substrate to transfer the plurality of particles to the second substrate.

In certain implementations, the one or more flexible joints comprises one or more of a universal joint, a compliant joint, or a joint with springs.

In certain implementations, the substrate is a rigid curved substrate comprising an axis; and the substrate is rotated about the axis to remove the plurality of particles from the first substrate and to transport the plurality of particles to the second substrate.

In certain implementations, one or more spacers are to provide a gap between the first substrate and the particle transferring unit; and the particle transferring unit is to manipulate the one or more spacers.

According to other aspects of the present disclosure, there is provided a method comprising: moving one or more of a particle transferring unit or a plurality of particles, wherein the plurality of particles are in a pattern on a first substrate, wherein the plurality of particles are to be within a first gap between the first substrate and an outer surface of the particle transferring unit in response to the moving; removing, by the particle transferring unit, the plurality of particles in the pattern from the first substrate in response to the plurality of particles being within the first gap; transporting, by the particle transferring unit, the plurality of particles secured to the outer surface to be within a second gap between the outer surface and a second substrate; and removing, by the second substrate, the plurality of particles from the particle transferring unit in response to the plurality of particles being within the second gap, wherein the plurality of particles are to be secured in the pattern to the second substrate.

In certain implementations, the particle transferring unit comprises a flexible substrate and one or more rollers, wherein the outer surface is an outer surface of the flexible substrate; the moving comprises moving the plurality of particles in the pattern towards the flexible substrate; and the transporting comprises rolling the flexible substrate over the one or more rollers.

In certain implementations, the outer surface of the particle transferring unit is a planar surface; the moving comprises positioning the particle transferring unit on the first substrate; and the removing the plurality of particles from the particle transferring unit comprises positioning the particle transferring unit on the second substrate subsequent to the positioning of the particle transferring unit on the first substrate.

In certain implementations, the method further comprising cleaning the plurality of particles after the removing of the plurality of particles from the first substrate and before the removing of the plurality of particles from the particle transferring unit.

In certain implementations, the removing of the plurality of particles from the first substrate is via one or more of electrical force, vacuum force, capillary force, or Van der Waals force.

In certain implementations, the removing of the plurality of particles from the particle transferring unit comprises contacting the plurality of particles with a tacky surface of the second substrate.

In certain implementations, the method further includes applying a voltage to the particle transferring unit to generate an electric field, wherein the removing of the plurality of particles from the first substrate is via one or more of electrostatic force, electrophoretic force, dielectrophoretic force, or other electrical force.

BRIEF DESCRIPTION OF THE DRAWINGS

The present disclosure described herein is illustrated by way of example and not by way of limitation in the accompanying figures. For simplicity and clarity of illustration, features illustrated in the figures are not necessarily drawn to scale. For example, the dimensions of some features may be exaggerated relative to other features for clarity. Further, where considered appropriate, reference labels have been repeated among the figures to indicate corresponding or analogous elements.

DETAILED DESCRIPTION

Figure 1A:
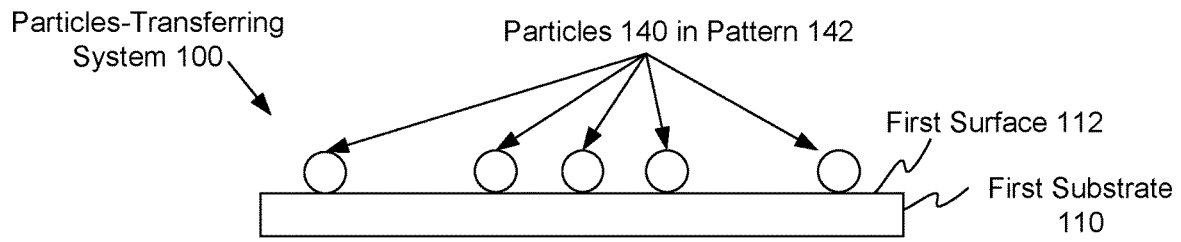
FIG. 1A illustrates a particles-transferring system including a first substrate including a first surface to support particles in a pattern, in accordance with implementations of the present disclosure.

Described herein are implementations of a particles-transferring system, a particle transferring unit, and methods for transferring particles from a first substrate to a second substrate. Particles may be arranged in a pattern in a first environment on an assembly substrate. The particles in the pattern may need to be transferred from the assembly substrate to an assembled object on a final substrate that is in a second environment. Transferring of the particles may one or more of disrupt the pattern of the particles, damage the particles, impact the chemistry or physical nature of the particles, or contaminate one or more of the particles, the assembled object, the final substrate, or the transfer system.

Aspects of the present disclosure address the above and other deficiencies by providing a particles-transferring system including a particle transferring unit to transfer the particles in a pattern from a first substrate to a second substrate. In one example, a particles-transferring system includes a first substrate, a second substrate, and a particle transferring unit. The particle transferring unit removes the particles in the pattern from the first substrate, secures the particles in the pattern to an outer surface of the particle transferring unit, and transports the particles in the pattern to the second substrate. The second substrate removes the particles in the pattern from the particle transferring unit and secures the particles to the surface of the second substrate. As described herein, the transferring of the particles from the first substrate to the second substrate is without disrupting the pattern, without damaging the particles, without impacting the chemistry and physical nature of the particles, and without contaminating the particles or particles-transferring system.

FIGS. 1A-E illustrate a particles-transferring system 100 including a first substrate 110, a second substrate 120, and a particle transferring unit 130. The particles-transferring system 100 is to transfer particles 140 in a pattern 142 from the first substrate 110 to the second substrate 120.

In one implementation, the particles-transferring system 100 is a micro-assembly printer. In one implementation, the particles 140 are one or more of feedstock, micro-scale feedstock, toner, chiplets, functional devices, biomaterials, etc. In one implementation, each of the particles 140 has a height and width of about 10 micrometers ($\mu$m). The transfer area (e.g., area within the first gap 114 or second gap 124) may be about 1 millimeter (mm) by 1 mm. In one implementation, each of the particles 140 has a height and width of about 1-1000 $\mu$m. In another implementation, each of the particles 140 has a height and width of about 1-10 mm.

The particles-transferring system 100 integrates the particles 140 into a functional heterogeneous system. In one implementation, the heterogeneous system is a millimeter-scale heterogeneous system. In one implementation, the heterogeneous system is larger than millimeter-scale. The particles-transferring system 100 can use forces to properly place the particles 140 to form a functional assembly. The functional assembly may include one or more of cyborg tissue, electronic therapeutics, hierarchical smart mechanical making structures, etc. The particles-transfer system 100 may remove the assembled objects (e.g., toners) from the first substrate 110 (e.g., assembly substrate, substrate supporting particles in a liquid) and place them on the second substrate (e.g., final substrate, substrate of a device module, surface of a device module).

During the transferring by the particles-transfer system 100, the particles 140 may be in a pattern 142 on the first substrate 110, in the substantially the same pattern 142 when secured by the particle transferring unit 130, and in substantially the same pattern 142 when secured by the second substrate 120 (e.g., permanently secured, a permanent bond between the particles 140 and the second substrate 120, etc.). In one implementation, the particles 140 in a pattern 142 are stacked in the pattern 142 onto other particles on the second substrate 120. Maintaining substantially the same pattern 142 on the first substrate 110 and on the second substrate 120 may be referred to as high position registration or high registration of the individual particles 140. High position registration of individual particles 140 may maintain the relative distances of each of the particles 140 from each other on the second substrate 120 within 1 $\mu$m of the relative distances of each of the particles 140 from each other on the first substrate 110. Particles-transferring system 100 may have high position registration (e.g., particles within 1 $\mu$m of relative distances on first substrate 110) and high throughput. High throughputs may be characterized by hundreds to thousands of particles 140 being transferred per second. High throughputs may be characterized by particles 140 within an area of 1 $mm^2$ to hundreds of $mm^2$ being transferred per second via the particle transferring unit 130.

FIG. 1A illustrates a particles-transferring system including a first substrate 110 including a first surface 112 to support particles 140 in a pattern 142, in accordance with implementations of the present disclosure. In one implementation, the particles 140 may be supported by the first substrate 110 in a liquid (e.g., in a liquid environment). In one implementation, the particles 140 may be supported by the first substrate 110 in a dry environment (e.g., in air, in a gas). The first substrate 110 may be an assembly substrate and the particles 140 in the pattern 142 may be an assembled object (e.g., toner). In one implementation, the first surface 112 is curved. In one implementation, the first surface 112 is planar.

Figure 1B:
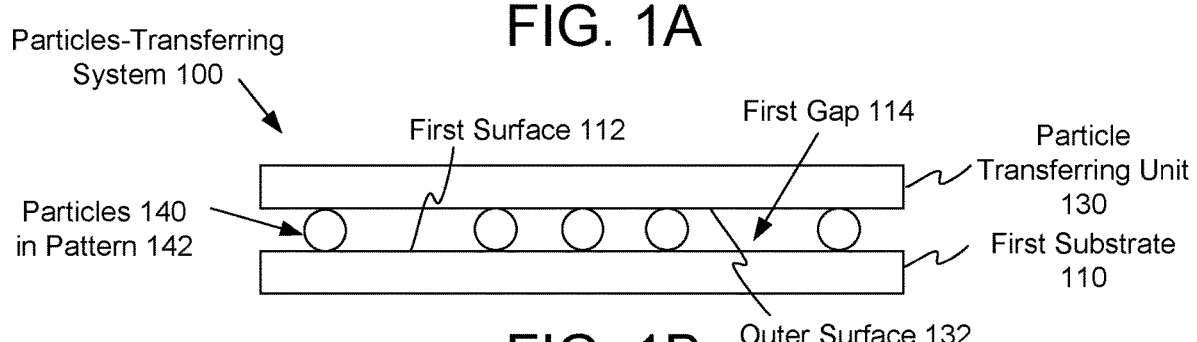
FIG. 1B illustrates a particles-transferring system including a particle transferring unit including an outer surface to be offset from the first surface of the first substrate by a first gap, in accordance with implementations of the present disclosure.

FIG. 1B illustrates a particles-transferring system 100 including a particle transferring unit 130 including an outer surface 132 to be offset from the first surface 112 of the first substrate 110 by a first gap 114, in accordance with implementations of the present disclosure. In one implementation, the first gap 114 may provide spacing between the particles 140 and the outer surface 132. In one implementation, the particles 140 may be contacting the outer surface 132. In one implementation, the particle transferring unit 130 includes a flexible substrate that moves across one or more rollers. In another implementation, the particle transferring unit rotates about an axis. The axis or rollers may be substantially parallel with the first surface 112 and the second surface 122. In another implementation, geometry of the outer surface 132 matches geometry of one or more of the first surface 112 or the second surface 122 (e.g., the outer surface 132 and the first surface are planar, the outer surface and the first surface are curved, etc.). The particle transferring unit 130 may align the outer surface 132 substantially parallel to the first surface 112 and translate the outer surface 132 substantially perpendicular to the first surface 112.

In one implementation, the particles 140 in the pattern 142 move toward the particle transferring unit 130. The particle transferring unit 130 may rotate and come in contact with the particles 140 row by row as the particles 140 move into the first gap 114 between the first surface 112 of the first substrate 110 and an outer surface 132 of the particle transferring unit 130 (e.g., FIG. 3A, FIG. 3B, FIG. 4, etc.). In one implementation, the particles 140 in the pattern 142 may be stationary on the first substrate 110 and the first substrate 110 may move towards the particle transferring unit 130. In one implementation, the first substrate 110 may be stationary and the particles 140 in the pattern 142 may move towards the particle transferring unit 130. The particles 140 may be charged (e.g., with an electric charge) and a force (e.g., electric force, magnetic force, electromagnetic force, etc.) may move the particles 140 in the pattern 142 towards the particle transferring unit. In another implementation, the particles 140 are uncharged and a dielectrophoretic force is applied to move the particles 140 in the pattern 142 towards the particle transferring unit 130.

In one implementation the particle transferring unit 130 moves toward the particles 140 in the pattern 142. The particle transferring unit 130 may come into contact (e.g., stamp on) the particles in the pattern (e.g., FIG. 5A, FIG. 5B, FIG. 5C).

Figure 5A:
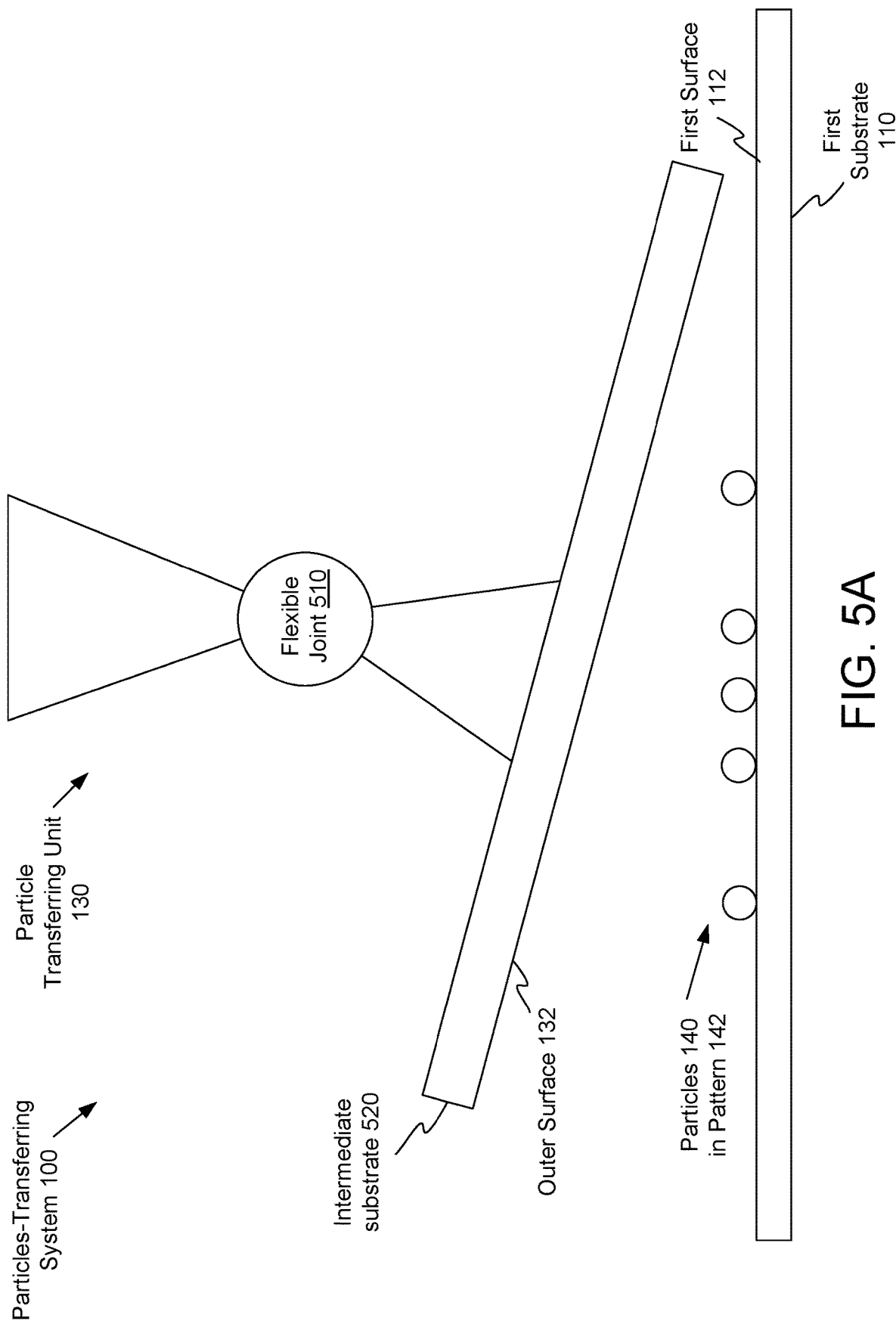
FIG. 5A illustrates a particles-transferring system including a particle transferring unit that includes a flexible joint, in accordance with implementations of the present disclosure.
Figure 5B:
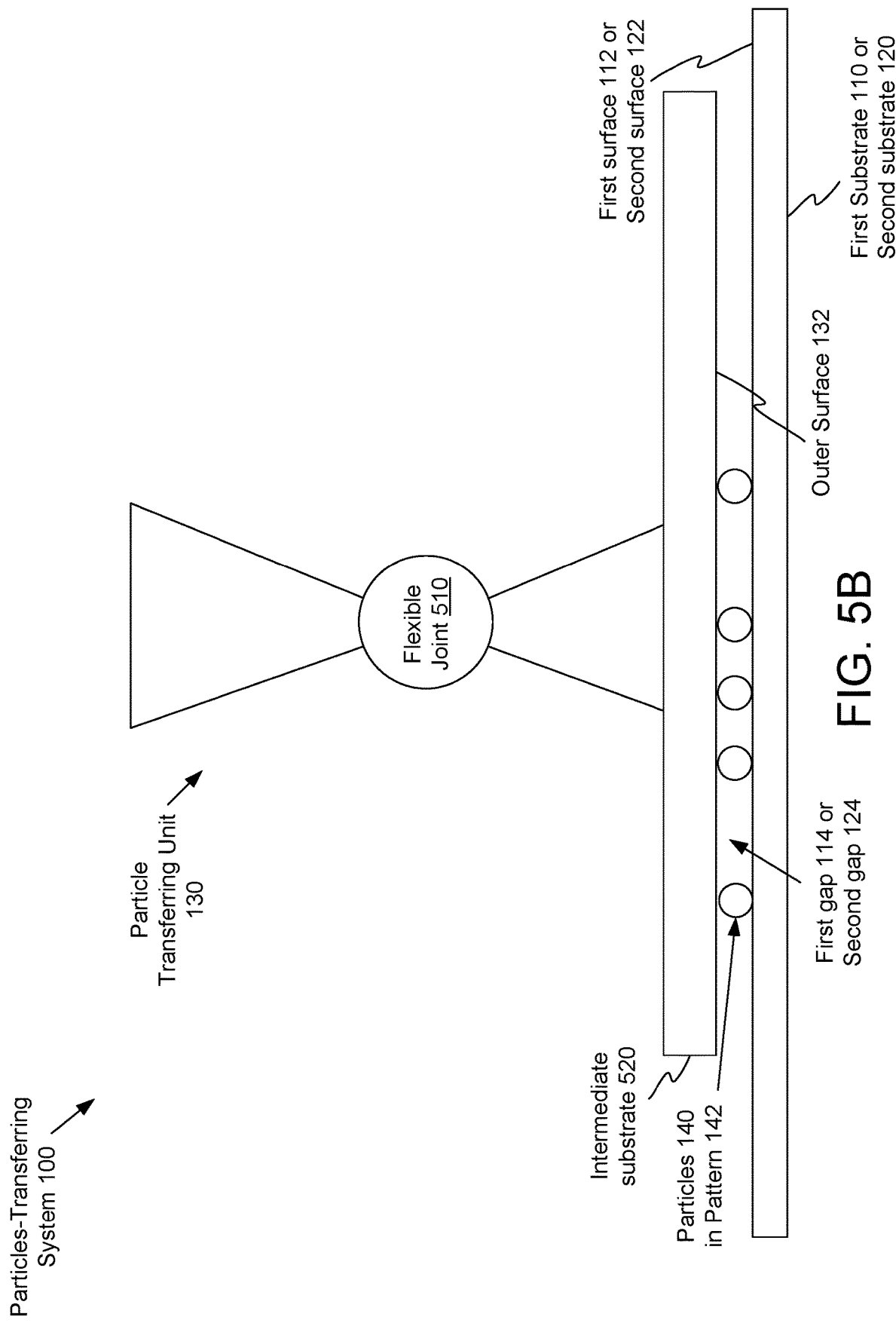
FIG. 5B illustrates a particles-transferring system including a particle transferring unit that includes a flexible joint, in accordance with implementations of the present disclosure.
Figure 5C:
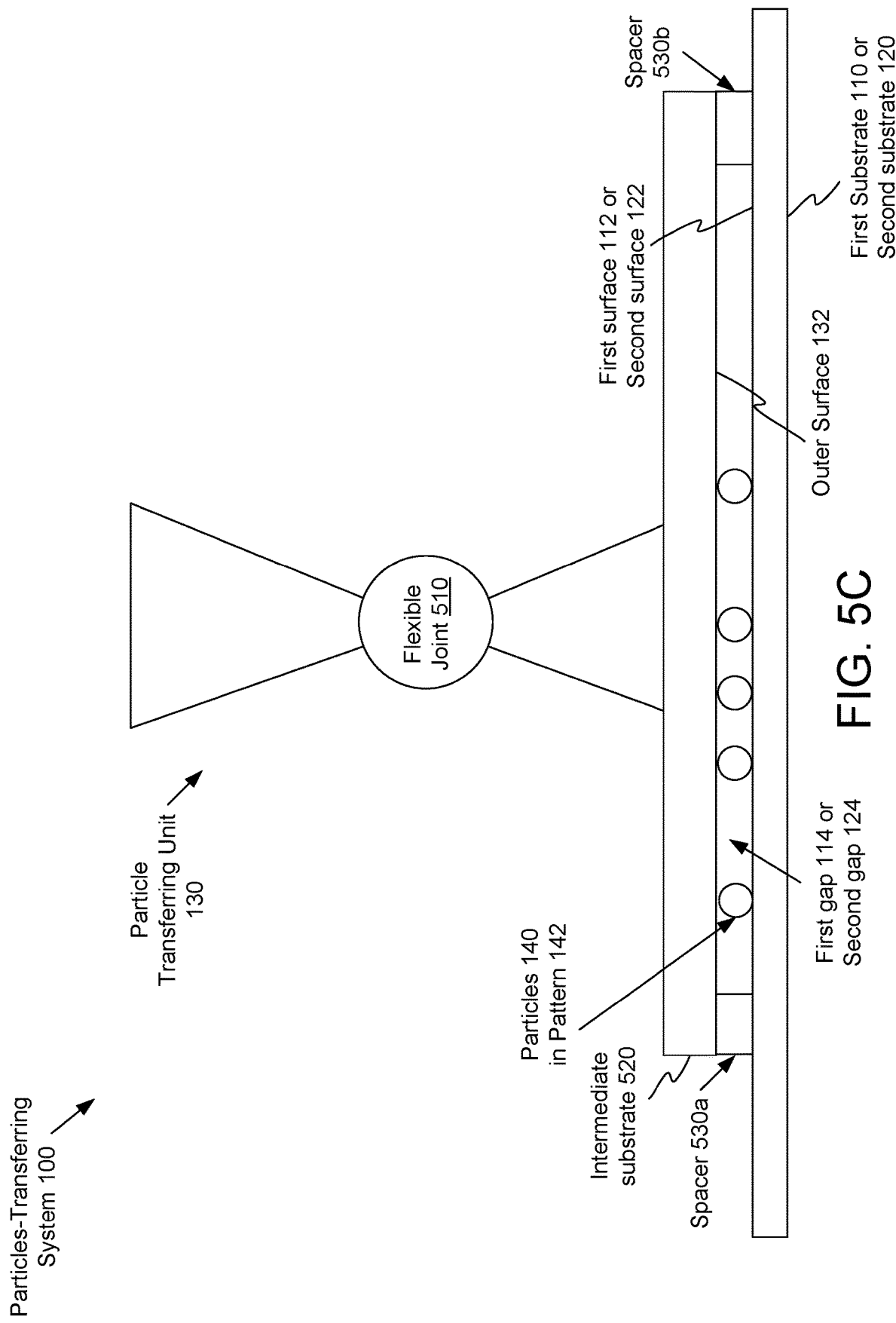
FIG. 5C illustrates a particles-transferring system including a particle transferring unit and spacers to provide a gap between a substrate and the particle transferring unit, in accordance with implementations of the present disclosure.

In one implementation, the first gap 114 is provided by one or more spacers (e.g., see FIG. 5C). The one or more spacers may be pre-manufactured to the first substrate 110 or the particle transferring unit 130. The one or more spacers may be removably attached to the first substrate 110 or the particle transferring unit 130. The first gap 114 may have a height that is greater than the height of the particles 140.

Figure 1C:
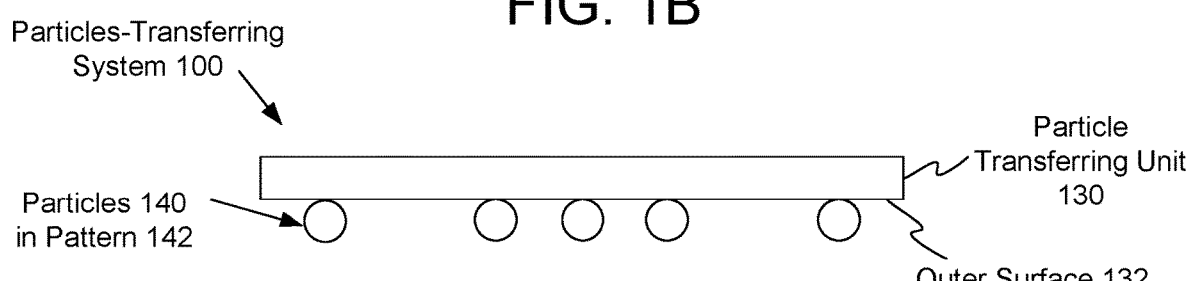
FIG. 1C illustrates a particles-transferring system including the particle transferring unit to secure the particles in the pattern to the outer surface, in accordance with implementations of the present disclosure.

FIG. 1C illustrates a particles-transferring system 100 including the particle transferring unit 130 to secure the particles 140 in the pattern 142 to the outer surface 132, in accordance with implementations of the present disclosure.

The particle transferring unit 130 may remove the particles 140 in the pattern 142 from the first surface 112 in response to the particles 140 being within the first gap 114. The particle transferring unit 130 may secure the particles 140 in the pattern 142 to the outer surface 132 via a force.

In one implementation, the particles 140 have an electric charge, the particle transferring unit 130 generates an electric field, and the particle transferring unit 130 removes the particles 140 from the first substrate 110 via an electrical force (e.g., electrostatic force, electrophoretic, other electrical force). In another implementation, the particles 140 have substantially no net electric charge, the particle transferring unit 130 generates an electric field gradient, and the particle transferring unit 130 removes the particles 140 from the first substrate 110 via a dielectrophoretic electrical force. In one implementation, the particle transferring unit 130 removes the particles 140 from the first substrate 110 via a capillary force (e.g., via channels, micro pipettes, hair, synthetic hair, etc.). In one implementation, the particle transferring unit 130 removes the particles 140 from the first substrate 110 via a Van der Waals force. In one implementation, the particle transferring unit 130 removes the particles 140 from the first substrate 110 via a vacuum force.

The particle transferring unit 130 removes the particles 140 from the first substrate 110 (e.g., from the liquid on the first substrate 110) via a first force and the particle transferring unit 130 secures the particles 140 to the outer surface 132 of the particle transferring unit 130 (e.g., maintains the particles 140 secured to the outer surface 132) via a second force while the particle transferring unit 130 transports the particles 140. In one implementation, the first force and the second force are the same type of force and the same magnitude. In one implementation, the first force and the second force are different magnitudes (e.g., the particle transferring unit 130 exerts a stronger force when transporting the particles 140 than when removing the particles 140 from the first substrate 110, the particle transferring unit 130 exerts a stronger force when removing the particles 140 from the first substrate 110 than when transporting the particles 140).

Figure 1D:
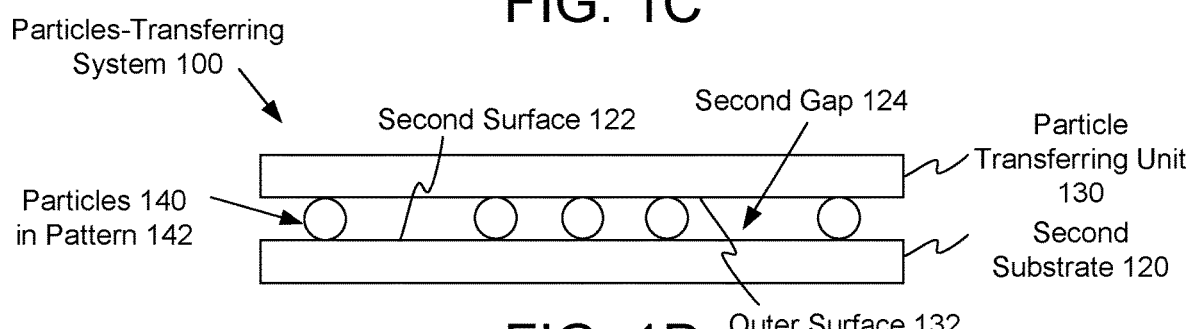
FIG. 1D illustrates a particles-transferring system including a second substrate including a second surface to be offset from the outer surface of the particle transferring unit by a second gap, in accordance with implementations of the present disclosure.

FIG. 1D illustrates a particles-transferring system 100 including a second substrate 120 including a second surface 122 to be offset from the outer surface 132 of the particle transferring unit 130 by a second gap 124, in accordance with implementations of the present disclosure. The height of the second gap 124 may be the same or less than the height of the particles 140.

In one implementation, an outer surface 132 of the particle transferring unit 130 is separated from the first surface 112 of the first substrate 110 by a first gap 114 and the outer surface of the particle transferring unit 130 may be separated from the second surface 122 of the second substrate 120 by a second gap 124. The outer surface 132 of the particle transferring unit 130 may move (e.g., rotate about an axis (see FIG. 4), roll across one or more rollers (see FIGS. 3A-B) and particles 140 that are within the first gap 114 may be removed from the first substrate 110 by the particle transferring unit 130, secured to the outer surface 132 by the particle transferring unit, and transported (e.g., rotated (see FIG. 4), moved via a flexible substrate (see FIGS. 3A-B)) to the second gap 124 between the outer surface 132 and the second surface 122.

In one implementation, the first substrate 110 is located in a first location and the second substrate 120 is located in a second location. The particle transferring unit 130 may perform a first movement (e.g., be stamped onto the first location) to create a first gap 114 between the outer surface 132 of the particle transferring unit and the first surface 112 of the first substrate 110. The particle transferring unit 130 may perform a second movement (e.g., be stamped on the second location) to create a second gap 124 between the outer surface 132 and the second surface 122 of the second substrate 120 (see FIGS. 5A-5C). In another implementation, the particle transferring unit 130 may remain stationary and the first substrate 110 and the second substrate 120 may move (e.g., the first substrate 110 may perform a first movement to create the first gap 114 and the second substrate 120 may perform a second movement (e.g., after the first substrate 110 is removed) to create the second gap). Particles 140 that are within the first gap 114 may be removed from the first substrate 110 by the particle transferring unit 130, secured to the outer surface 132 by the particle transferring unit, and transported (e.g., by moving the particle transferring unit 130, by moving the first substrate 110 and the second substrate 120) to the second gap 124 between the outer surface 132 and the second surface 122.

In one implementation, the second gap 124 is provided by one or more spacers (e.g., see FIG. 5C). The one or more spacers may be pre-manufactured to the second substrate 120 or the particle transferring unit 130. The one or more spacers may be removably attached to the second substrate 120 or the particle transferring unit 130. The second gap 124 may have a height that is less than the height of the particles 140.

Figure 1E:
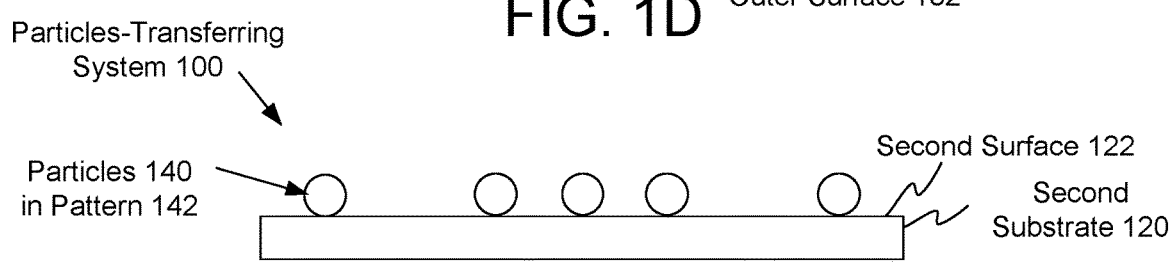
FIG. 1E illustrates a particles-transferring system including the second substrate including a second surface to secure the particles in the pattern, in accordance with implementations of the present disclosure.

FIG. 1E illustrates a particles-transferring system 100 including the second substrate 120 including a second surface 122 to secure the particles 140 in the pattern 142, in accordance with implementations of the present disclosure.

The second substrate 120 is to remove the particles 140 in the pattern 142 from the particle transferring unit 130 in response to the particles being within the second gap 124. The particles 140 are to be secured in the pattern 142 to the second surface 122.

In one implementation, the second surface 122 comprises a tacky surface comprising one or more of adhesive, photoresist, polymers, silicon, or polydimethylsiloxane (PDMS). The tacky surface may cover a portion of the second surface 122 or the entire surface of the second surface 122. The tacky surface may be in a pattern (e.g., a checkerboard pattern) on the second surface 122. The second substrate 120 may remove the particles 140 from the particle transferring unit 130 and secure the particles 140 to the second surface 122 in response to the particles 140 contacting the tacky surface.

In one implementation, the second substrate 120 is to remove the particles 140 in the pattern 142 from the particle transferring unit 130 via a second force. The second force may be greater than the force exerted by the particle transferring unit 130 to secure the particles 140 to the outer surface 132. For example, the second substrate 120 may exert a second electrical force on the particles 140 and the particle transferring unit 130 may exert a first electrical force on the particles 140, where the second electrical force is greater than the first electrical force. In one implementation, the second substrate 120 may exert a type of force on the particles 140 that is different than the type of force exerted by the first particle transferring unit 130. The force exerted by the second substrate 120 and the force exerted by the particle transferring unit 130 may be selected from adhesive force (e.g., mechanical force, sticking together), vacuum force, capillary force, cohesive forces (e.g., intermolecular forces, hydrogen bonding, Van der Waals force, etc.), electric force (e.g., electrostatic force, electrophoretic force, di electrophoretic force, other electric force, etc.), etc.

In one implementation, the force used by the particle transferring unit 130 may be modulated (e.g., turned off, lowered) at the portion of the outer surface 132 located at the second gap 124 (e.g., the electrical field generated at the portion of the outer surface 132 may be turned off or lowered in response to the portion of the outer surface 132 creating the second gap 124).

Figure 2:
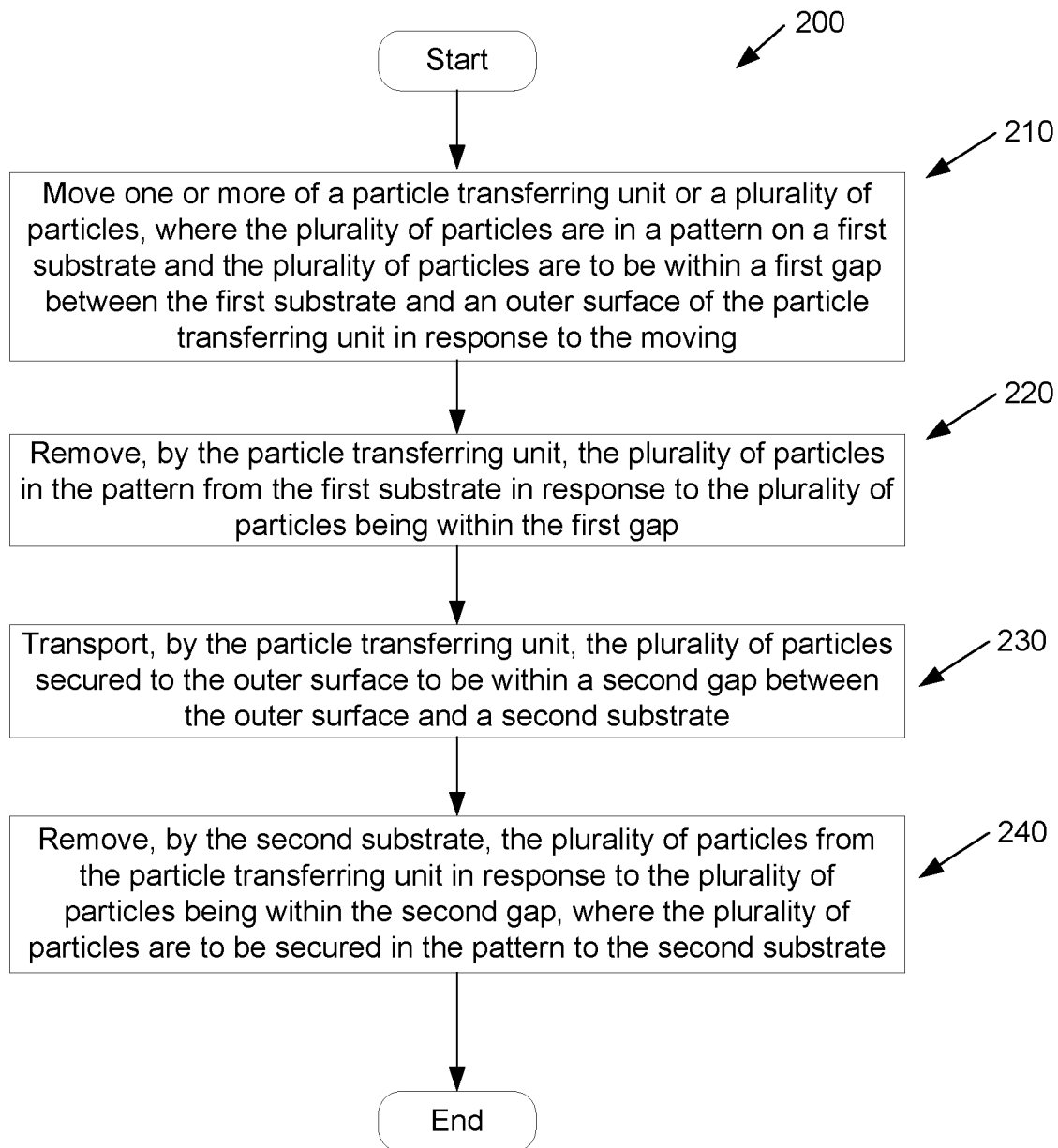
FIG. 2 is a flow diagram illustrating a method of transferring particles in a pattern from a first substrate to a second substrate, in accordance with implementations of the present disclosure.

FIG. 2 is a flow diagram illustrating a method 200 of transferring particles 140 in a pattern 142 from a first substrate 110 to a second substrate 120, in accordance with implementations of the present disclosure.

At block 210, one or more of a particle transferring unit 130 or particles 140 are moved. The particles 140 are in a pattern 142 on a first substrate 110. The particles are to be within a first gap 114 between the first substrate 110 and the outer surface 132 of the particle transferring unit 130 in response to the moving. In one implementation, block 210 includes moving the first substrate 110 towards the particle transferring unit 130 to move the particles 140 in the pattern 142 into the first gap 114 (e.g., the particles 140 are not moved relative to the first substrate 110). In one implementation, block 210 includes moving the particles 140 in the pattern 142 into the first gap 114 (e.g., the particles 140 are charged, the first substrate and the particle transferring unit 130 are stationary, and an electric force causes the particles 140 to move towards the particle transferring system). In one implementation, the particle transferring unit 130 is moved to create a first gap 114 where the particles 140 are located (e.g., the particle transferring unit 130 is stamped onto the particles 140).

At block 220, the particles 140 in the pattern 142 are removed (e.g., by the particle transferring unit 130) from the first substrate 110. Block 220 may be in response to the particles 140 being within the first gap 114 (e.g., block 210). Block 220 may include the particle transferring unit 130 removing the particles 140 from the first substrate 110 via a force. The force may be one or more of adhesive force (e.g., mechanical force, sticking together), vacuum force, capillary force, cohesive forces (e.g., intermolecular forces, hydrogen bonding, Van der Waals force, etc.), electrical force (e.g., electrostatic force, electrophoretic force, dielectrophoretic force, other electric force, etc.), etc. In one implementation, block 220 is in response to the particles 140 moving into the first gap 114 and being removed from the first substrate 110 by being secured to the outer surface 132 of the particle transferring unit 130 (e.g., as the outer surface 132 moves around one or more rollers (see FIGS. 3A-B), as the outer surface 132 rotates about an axis (see FIG. 4), as the outer surface 132 is positioned on the first substrate 110 and is removed from the first substrate 110 (see FIGS. 5A-C)).

In one implementation, method 200 may include applying a voltage to the particle transferring unit 130 to generate an electric field. Block 220 may include using electrical force to transfer particles 140 in the pattern 142 from a liquid on the first substrate 110. The block 220 may facilitate high registration (e.g., particles 140 in substantially the same pattern 142 on the particle transferring unit 130 as the pattern 142 of the particles 140 on the first substrate 110) by maintaining precise micro-gap control (e.g., using spacers to maintain a precise first gap 114). The block 220 may facilitate high registration by maintaining the first substrate and the outer surface 132 parallel and aligned.

At block 230, the particles 140 are transported (e.g., by the particle transferring unit) to be within a second gap 124 between the outer surface 132 and a second substrate 120. Block 230 may include the particles 140 secured to the outer surface 132 being transported by the particle transferring unit 130. Block 230 may include securing the particles 140 to the particle transferring unit 130 via a force. In one implementation, the force may be the same type or quantity as exerted in block 220. In one implementation, the force is a different type than the force exerted in block 220. In one implementation, the force is a different quantity of force than the force exerted in block 220. The particles 140 may be transported by securing the particles 140 to the outer surface 132 and one or more of moving the outer surface 132 around one or more rollers (see FIGS. 3A-B), rotating the outer surface 132 around an axis (see FIG. 4), or positioning the outer surface 132 on the first substrate 110 and removing the outer surface 132 from the first substrate 110 (see FIGS. 5A-C)).

At block 240, the particles 140 are removed (e.g., by the second substrate 120) from the particle transferring unit 130. Block 240 may be in response to the particles 140 being within the second gap 124. The particles 140 are to be secured in the pattern 142 to the second substrate 120. The second substrate 120 may include a second surface 122 that includes a tacky surface. Block 240 may include (e.g., may be in response to) contacting the particles 140 with the tacky surface of the second substrate 120. In one implementation, a tacky surface is created on the second substrate 120, the intermediate substrate rolls on the second substrate 120, and particles 140 on the intermediate substrate are picked up by the second substrate 120 in response to the particles 140 contacting the tacky surface. The tacky surface may be created using materials including (but not limited to) adhesive, photoresist, polymers, silicon (e.g., Gel-Pak® silicone film), and PDMS.

In one implementation, the particle transferring unit 130 includes a flexible substrate and one or more rollers, where the outer surface 132 is an outer surface of the flexible substrate. Block 220 (e.g., the moving) may include moving the particles 140 in the pattern 142 towards the flexible substrate. Block 230 (e.g., the transferring) may include rolling the flexible substrate over the one or more rollers.

In one implementation, the outer surface 132 of the particle transferring unit 130 is a planar surface. Block 210 (e.g., the moving) may include positioning the particle transferring unit 130 on the first substrate 110. Block 220 (e.g., the removing) may include removing the particle transferring unit 130 from the first substrate 110. Block 230 (e.g., the transferring) may include moving the particle transferring unit 130 to be on the second substrate 120. Block 240 (e.g., removing) includes positioning the particle transferring unit 130 on the second substrate 120 (e.g., contacting the particles 140 on the tacky surface of the second substrate 120) subsequent to the positioning of the particle transferring unit 130 on the first substrate 110 (e.g., and removing the particle transferring unit 130 from the second substrate 120).

Method 200 may include cleaning the particles 140 after block 220 (e.g., the removing of the particles 140 from the first substrate 110) and before block 240 (e.g., the removing of the particles 140 from the particle transferring unit 130). Examples of cleaning include air knife or vacuum induced removal of liquid from the particles, rinsing of particles by a solvent stream, etc.

In one implementation, the particles-transferring system 100 may include multiple particle transferring units. The particle transferring units may be alternatively used to transfer particles from a first substrate to a second substrate (e.g., multiple particle transferring units to take particles from the first substrate to the second substrate). Use of multiple particle transferring units may increase the transfer speed. The particles-transferring system 100 may include one to several dozen particle transferring units.

For example, a first plurality of particles may be assembled on the first substrate 110. A first particle transferring unit may remove the first plurality of particles from the first substrate 110 and transport the first plurality of particles. A second plurality of particles may be assembled on the first substrate 110 and may be ready to be transported before the first particle transferring unit is ready to remove the second plurality of particles. A second particle transferring unit may remove the second plurality of particles from the first substrate 110 and transport the second plurality of particles.

In one implementation, the method 200 has more than one particle transferring unit 130 (e.g., more than one intermediate substrate) and additional transferring operations.

Figure 3A:
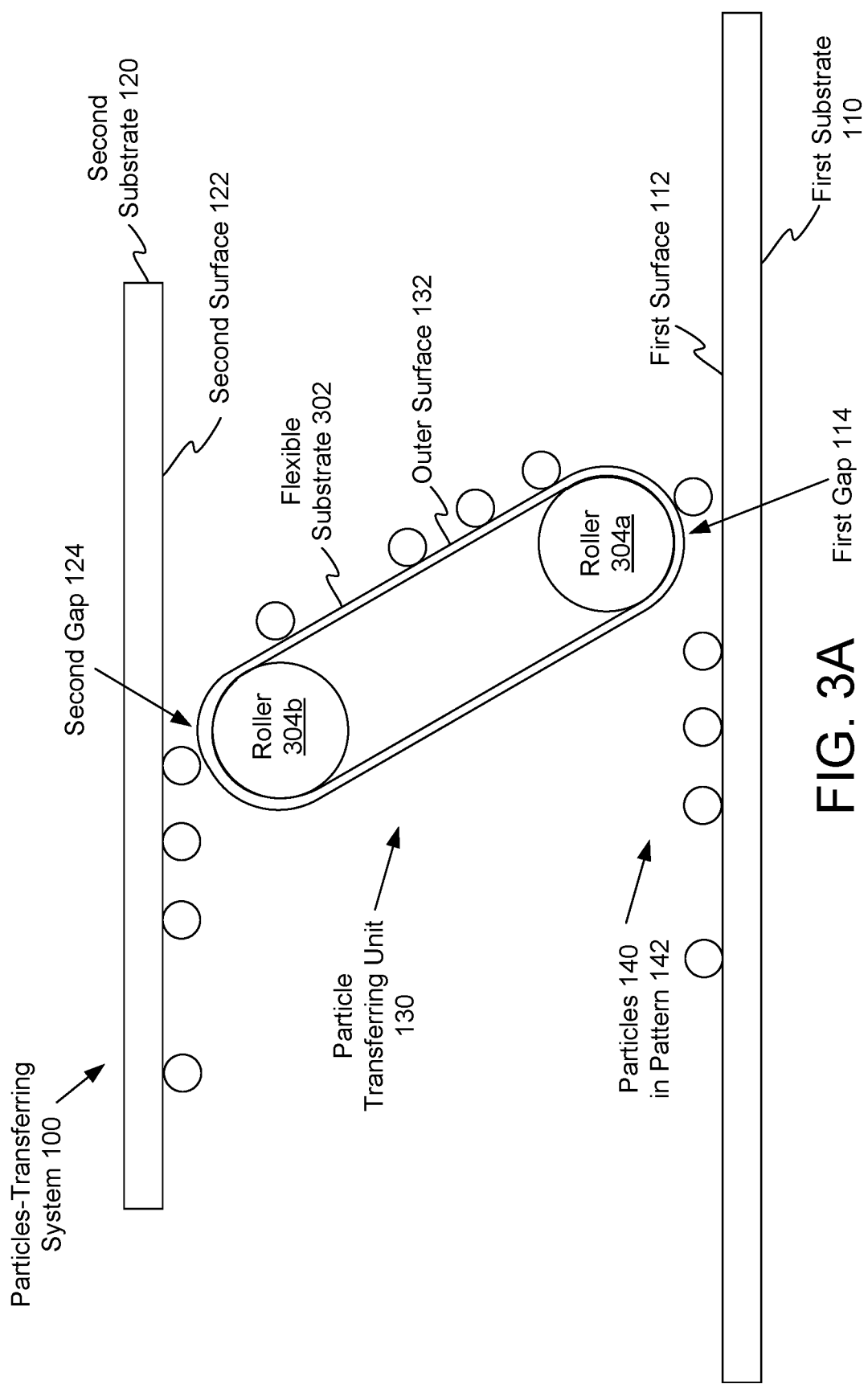
FIG. 3A illustrates a particles-transferring system including a particle transferring unit that includes one or more rollers and a flexible substrate to transfer particles in a pattern from a first substrate to a second substrate, in accordance with implementations of the present disclosure.
Figure 3B:
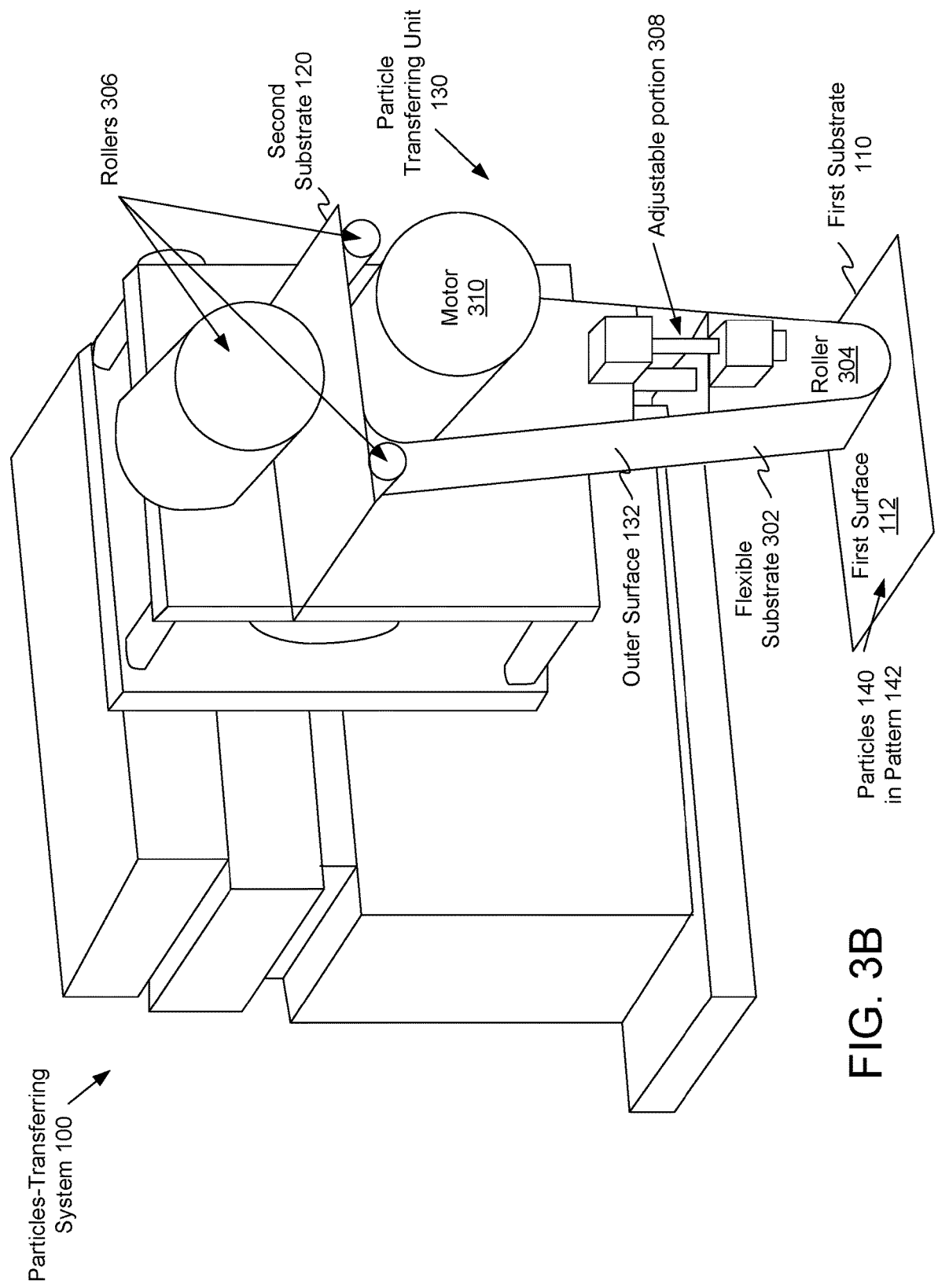
FIG. 3B illustrates a particles-transferring system including a particle transferring unit that includes one or more rollers and a flexible substrate to transfer particles in a pattern from a first substrate to a second substrate, in accordance with implementations of the present disclosure.
Figure 4:
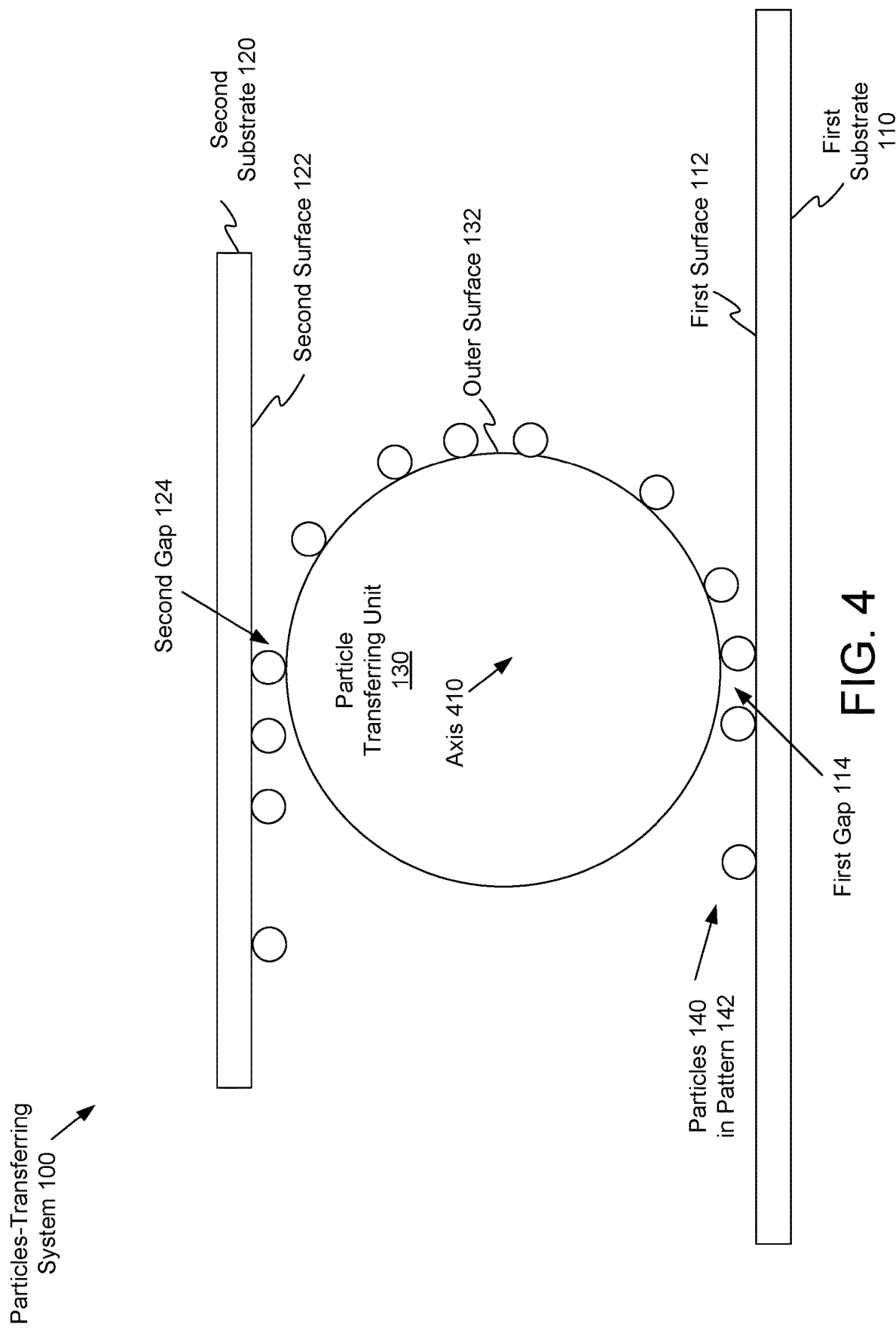
FIG. 4 illustrates a particles-transferring system including a particle transferring unit that rotates about an axis to transfer particles in a pattern from a first substrate to a second substrate, in accordance with implementations of the present disclosure.

FIGS. 3A-4 illustrate a particles-transferring system 100 to transfer particles 140 (e.g., continuously) in a rolling or rotating transfer scheme (e.g., the particle transferring unit 130 includes a roller 304 or a curved surface). In a rolling transfer scheme, the axis of the roller 304 is to be parallel to the corresponding substrate (e.g., axis of roller 304a is to be parallel with the first surface 112 of first substrate 110, axis of roller 304b is to be parallel with the second surface 122 of second substrate 120) and is to be aligned perpendicular to the relative motion of surfaces to make contact or have a uniform distance across the targeted transfer area (e.g., first gap 114, second gap 124). In a rotating transfer scheme, the axis 410 is to be parallel to the first surface 112 and the second surface 122 to make contact or have a uniform distance across the targeted transfer area (e.g., first gap 114, second gap 124).

A particle transferring unit 130 that rotates or includes rollers may have a higher throughput than a planar particle transferring unit 130. The particle transferring unit 130 that rotates or includes rollers may transfer the particles 140 row by row from the first substrate to the second substrate which increases the throughput (e.g., speed of the transferring).

FIG. 3A illustrates a particles-transferring system 100 including a particle transferring unit 130 that includes one or more rollers 304 (e.g., roller 304a, roller 304b) and a flexible substrate 302 to transfer particles 140 in a pattern 142 from a first substrate 110 to a second substrate 120, in accordance with implementations of the present disclosure.

One or more of the particles 140 in pattern 142 or the first substrate 110 may move at a first velocity towards the particle transferring unit 130. The flexible substrate 302 may rotate at a second velocity around the one or more rollers 304. The second substrate 120 may move at a third velocity (e.g., in the opposite direction from the first substrate 110). In one implementation, the first, second, and third velocities are substantially equal and each of the particles 140 form the same pattern 142 and are the same distance from each other on the first substrate 110, on the flexible substrate 302 of the particle transferring unit 130, and on the second substrate 120. In one implementation, two or more of the first, second, and third velocities are different from each other and each of the particles 140 form the same pattern 142, but are different distances from each other on two or more of the first substrate 110, on the flexible substrate 302 of the particle transferring unit, and on the second substrate 120 (e.g., the pattern 142 of particles 140 is expanded, the pattern of 142 of particles is condensed, the pattern 142 of particles 140 on the second substrate 120 has an amplification of distance from the pattern 142 of particles 140 on the first substrate 110). The particles 140 are relatively the same distance from each other on the first substrate 110, on the flexible substrate 302 of the particle transferring unit, and on the second substrate 120. For example, on the first substrate 110 a first particle is 2 millimeters (mm) from a second particle and the second particle is 4 mm from a third particle and, after being transferred to the second substrate 120, the first particle is 1 mm from the second particle and the second particle is 2 mm from the third particle.

FIG. 3B illustrates a particles-transferring system 100 including a particle transferring unit 130 that includes one or more rollers 304 and a flexible substrate 302 to transfer particles 140 in a pattern 142 from a first substrate 110 to a second substrate 120, in accordance with implementations of the present disclosure.

The particle transferring unit 130 may include a motor 310 (e.g., a piezoelectric motor, an electric motor, etc.) to move the flexible substrate 302 across the one or more rollers 304. The particles-transferring system 100 may include rollers 306. One or more of the rollers 306 may support the second substrate 120. One or more of the rollers 306 may be motorized to move the second substrate 120 relative to the movement of the flexible substrate 302 of the particle transferring unit 130. In one implementation, one or more of the rollers 306 move the second substrate 120 at a velocity that is the same as the velocity of the flexible substrate 302 and the particles 140 are in the same pattern 142 and the same distance from each other on the flexible substrate 302 and after being transferred onto the second substrate 120. In one implementation, one or more of the rollers 306 move the second substrate 120 at a velocity that is not the same as the velocity of the flexible substrate 302 and the particles 140 are in the same pattern 142 and are the same relative distance (e.g., scaled by the same factor to be a greater distance from each other or a lesser distance from each other) from each other on the flexible substrate 302 and after being transferred onto the second substrate 120.

The particle transferring unit 130 may include an adjustable portion 308. The adjustable portion 308 may be adjustable to maintain a tight fit between the one or more rollers 304 and the flexible substrate 302. The adjustable portion may be adjustable to maintain a parallel and aligned gap (e.g., first gap 114, second gap 124) between the outer surface 132 and the corresponding surface (e.g., first surface 112 of first substrate 110, second surface 122 of second substrate 120). In one implementation, the adjustable portion 308 may be a flexible joint (e.g., flexible joint 510).

FIG. 4 illustrates a particles-transferring system 100 including a particle transferring unit 130 that rotates about an axis 410 to transfer particles 140 in a pattern 142 from a first substrate 110 to a second substrate 120, in accordance with implementations of the present disclosure.

Particle transferring unit 130 of FIG. 4 may be similar to particle transferring unit of FIG. 3A or FIG. 3B. Particle transferring unit 130 rotates about an axis 410 (e.g., as opposed to having rollers and a flexible substrate). The particle transferring unit 130 may not be flexible. The particle transferring unit may have a circular cross-section (e.g., may be cylindrical). In one implementation, the axis 410 is substantially parallel with the first substrate 110 and the second substrate 120. In one implementation, the axis 410 is substantially parallel with a portion of the first surface 112 in the first gap 114 and a portion of the second surface 122 in the second gap 124.

FIGS. 5A-5C illustrate a particles-transferring system 100 to transfer particles 140 in a planar transfer scheme. In a planar transfer scheme, the two planar substrates (e.g., first substrate 110 and particle transferring unit 130, second substrate 120 and particle transferring unit 130) are to be parallel to make contact or have a uniform distance across the targeted transfer area. A flexible joint design facilitates the alignment and parallelizing of the particle transferring unit 130 with the first substrate 110 and the second substrate 120. Although a flexible joint 510 is shown in relation to FIGS. 5A-B, a flexible joint 510 can be used in different implementations (e.g., FIGS. 3A-4) to facilitate the alignment and parallelizing of the particle transferring unit 130 with the first substrate 110 and the second substrate 120.

FIG. 5A illustrates a particles-transferring system 100 including a particle transferring unit 130 that includes a flexible joint 510, in accordance with implementations of the present disclosure.

The particles-transferring system 100 may produce high registration (e.g., pattern 142 of particles 140 on the second substrate 120 is substantially the same as the pattern 142 of particles 140 on the first substrate 110) and high yield (e.g., substantially all of the particles 140 are transferred from the first substrate 110 to the second substrate 120) in response to parallelism and alignment between the first substrate 110 and the particle transferring unit 130 and between the second substrate 120 and the particle transferring unit 130.

Particle transferring unit 130 may include a flexible joint 510 (e.g., a flexible joint 510 in a substrate-holding fixture) and an intermediate substrate 520. The flexible joint 510 may allow the intermediate substrate 520 to self-adapt to have parallel contact with the particles 140 on the first substrate 110 (e.g., bottom substrate). All of the particles 140 in a pattern 142 may touch the outer surface 132 of the intermediate substrate 520.

In some implementations, the intermediate substrate 520 is coupled to a substrate-holding fixture. The intermediate substrate 520 is aligned and transported in a manner so that the intermediate substrate 520 is brought into proximity with the first substrate 110 (e.g., assembler plate) and with the second substrate 120 (e.g., receiver plate, final substrate) with tightly controlled parallelism and separation.

FIG. 5B illustrates a particles-transferring system 100 including a particle transferring unit 130 that includes a flexible joint 510, in accordance with implementations of the present disclosure.

The intermediate substrate 520 is coupled to one or more flexible joints 510 and the intermediate substrate 520 is positioned, by the one or more flexible joints 510, on the first substrate 110 to remove the particles 140 in the pattern 142 from the first substrate 110. The intermediate substrate 520 is positioned, by the one or more flexible joints 510, on the second substrate 120 to transfer the particles 140 in the pattern 142 to the second substrate 120. The one or more flexible joints 510 may include one or more of a universal joint, a compliant joint, a joint with springs, or a rubber flexible joint. A flexible mechanism (particle transferring unit 130) may include multiple joints or a compliance design of the whole fixture (is not limited to one joint).

FIG. 5C illustrates a particles-transferring system 100 including a particle transferring unit 130 and one or more spacers 530 to provide a gap (e.g., first gap 114, second gap 124) between the outer surface 132 of the particle transferring unit 130 and a surface of a substrate (e.g., first surface 112 of first substrate 110, second surface 122 of second substrate 120), in accordance with implementations of the present disclosure.

Although one or more spacers 530 are shown in relation to FIG. 5C, one or more spacers can be used in different implementations (e.g., FIGS. 3A-5B) to facilitate the alignment and parallelizing of the particle transferring unit 130 with one or more of the first substrate 110 or the second substrate 120 and creating of a gap (e.g., first gap 114, second gap 124) between the outer surface 132 and the surface of a substrate (e.g., first surface 112 of first substrate 110, second surface 122 of second substrate 120).

The gap (e.g., first gap 114, second gap 124) between the outer surface 132 and the surface of a substrate (e.g., first surface 112 of first substrate 110, second surface 122 of second substrate 120) may be larger than the height of the particles 140 so that the particles 140 travel freely in the lateral direction from the first substrate 110 to the intermediate substrate 520 before and when transfer occurs. In some implementations, the gap is to be minimized (e.g., to a microscale, 1-10 μm) and uniform across the transfer areas (e.g., portions of the surfaces creating the first gap 114, portions of the surfaces creating the second gap 124) to achieve a high registration transfer. One or more spacers 530 may be used to achieve precise control of the gap. In one implementation, each of the one or more spacers 530 may have a larger height than the height of the particles 140. In one implementation, each of the one or more spacers 530 may have a height that is substantially the same as the height of the particles 140. One or more of the spacers 530 may be between the intermediate substrate 520 and the first substrate 110 or second substrate 120. The gap (e.g., first gap 114, second gap 124) may be based on the height of the one or more spacers 530.

In one implementation, the one or more spacers 530 may be pre-fabricated terraces, stripes, arbitrary patterns, etc. (e.g., integral to, not removably coupled to) on one or more of the substrates (e.g., first substrate 110, second substrate 120, intermediate substrate 520, etc.). In one implementation, the one or more spacers 530 are not permanently attached (e.g., are removably coupled) to one or more of the substrates (e.g., first substrate 110, second substrate 120, intermediate substrate 520, etc.). In one implementation, the one or more spacers 530 are charged objects that can be manipulated using one or more of the substrates (e.g., first substrate 110, second substrate 120, intermediate substrate 520, etc.) and placed in a position. The gap can be modulated using the one or more spacers 530 of different heights (e.g., spacers 530 of a first height can be used with particles of a second height and spacers of a third height can be used with particles of a fourth height).

In one implementation, a first spacer 530a and second spacer 530b may be coupled to the particle transferring unit 130. The distance between the first spacer 530a and the second spacer 530b may be greater than a width of one or more of the first substrate 110 or the second substrate 120 (e.g., the first or second substrate may fit between the first and second spacers 530 so that the spacers 530 do not contact the first or second substrate). In one implementation, one or more of the substrates may have one or more recesses or indentations to accommodate the one or more spacers 530.

Figure 6A:
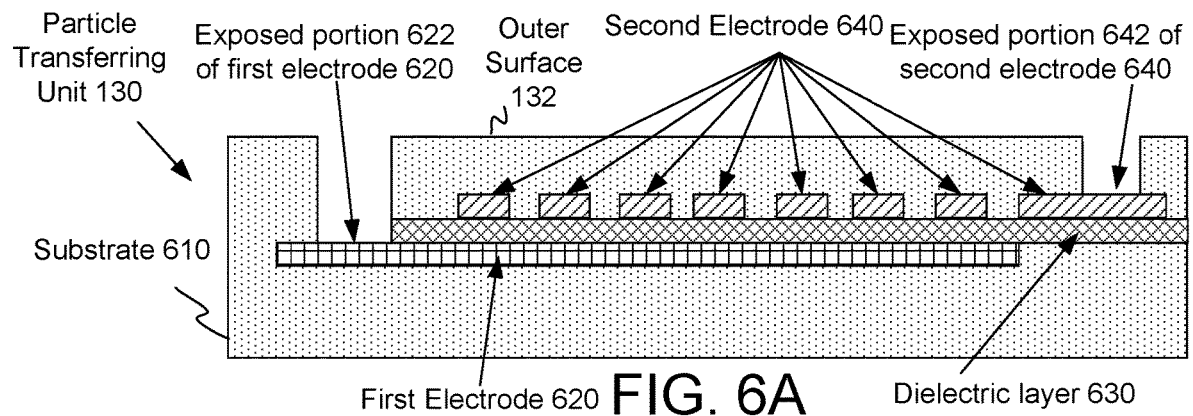
FIG. 6A illustrates a side view cross-section of a particle transferring unit that includes a first electrode and a second electrode, in accordance with implementations of the present disclosure.

FIG. 6A illustrates a side view cross-section of a particle transferring unit 130 that includes a first electrode 620 and a second electrode 640, in accordance with implementations of the present disclosure.

The particle transferring unit 130 includes a substrate 610 (e.g., an intermediate substrate, an electrode grid substrate with an electrode grid design to create an electric field with an applied voltage). The substrate 610 can be manufactured using fabrication processes for printed circuit boards (PCB), flexible circuits, microelectromechanical systems (MEMS), semiconductors, or other multilayer devices.

The particle transferring unit 130 includes at least two electrodes on the substrate and a dielectric layer 630 in between the at least two electrodes. Each of the electrodes may be a single layer or multiple layers of electrically conductive material and the dielectric layer is not electrically conductive or is minimally electrically conductive. The electrodes may be formed using a deposition technique including (but not limited to) chemical vapor deposition (CVD), physical vapor deposition (PVD), painting, thermal spray, evaporation, sputtering, screen printing, wire coating, inkjet printing, thin film laminating, plating, etc.

In one implementation, the particle transferring unit 130 includes a first electrode 620 on the substrate 610, a dielectric layer 630 on the first electrode 620, and a second electrode 640 on the dielectric layer 630. The substrate 610 may include one or more layers. The first electrode 620 may be on a first layer of substrate 610 and a second layer of substrate 610 may be on second electrode 640. The first electrode 620 may have an exposed portion 622 (e.g., not covered by substrate 610) and the second electrode 640 may have an exposed portion 642 (e.g., not covered by substrate 610).

The first electrode 620 and the second electrode 640 are to form an electric field to remove particles 140 in a pattern 142 from a first substrate 110, secure the particles 140 in the pattern 142 to the particle transferring unit 130, and transfer the particles 140 in the pattern 142 to a second substrate 120. The particles 140 may be charged (e.g., properly charged to be removed by the electric field generated by the particle transferring unit 130, charged to be attracted by the particle transferring system). The electric field creates an electric force to pick up the particles 140 and hold the particles 140 onto the substrate 610. The electric force may include (but are not limited to) electrostatic, electrophoretic, or dielectrophoretic forces depending on the type of charge of the particles 140. During the transfer, the electrical signal (e.g., AC or DC signal that has a peak-to-peak amplitude of several volts to several hundred volts) can be modulated to control adhesion between the particles 140 and the substrate 610.

The first electrode 620 may be a continuous layer. The second electrode 640 may include a grid pattern (e.g., a square grid pattern) including a first electrode grid and a second electrode grid. The first electrode grid may be powered independently from the second electrode grid to modulate the electric field locally (e.g., each electrode grid pixel may be powered independently to modulate the electrical field locally). The electrodes may have a design that allows electrode grids in a certain region to be powered independently to modulate the electrical field locally. The electric field may create an electric force to remove the particles 140 from the first substrate 110 and secure the particles 140 on the particle transferring unit 130. A concentrated and non-uniform electric field can be generated on the upside (outer surface 132) of the substrate 610. Different electrodes designs can be chosen and optimized to create desired distributions of the electric field for different particle size, geometry, charge, and materials.

In one implementation, the particle transferring unit 130 may include integrated photosensitive switches to power the particle transferring unit 130 optically.

In one implementation, the substrate 610 may be flexible (e.g., may be flexible substrate 302) and coupled to one or more rollers (e.g., one or more rollers 304). The substrate 610 may be rotated over the rollers 304 to remove and transport the particles 140 (see FIGS. 3A-B).

In one implementation, the substrate 610 is a rigid curved substrate comprising an axis 410. The substrate may be rotated about the axis 410 to remove the particles 140 from the first substrate 110 and to transport the particles 140 to the second substrate 120 (see FIG. 4).

In one implementation, the substrate 610 (e.g., intermediate substrate 520) is coupled to one or more flexible joints 510. The substrate 610 may be positioned, by the one or more flexible joints 510, on the first substrate 110 to remove the particles 140 from the first substrate 110. The substrate 610 may be positioned, by the one or more flexible joints 510, on the second substrate 120 to transfer the particles 140 to the second substrate 120 (see FIGS. 5A-C).

Figure 6B:
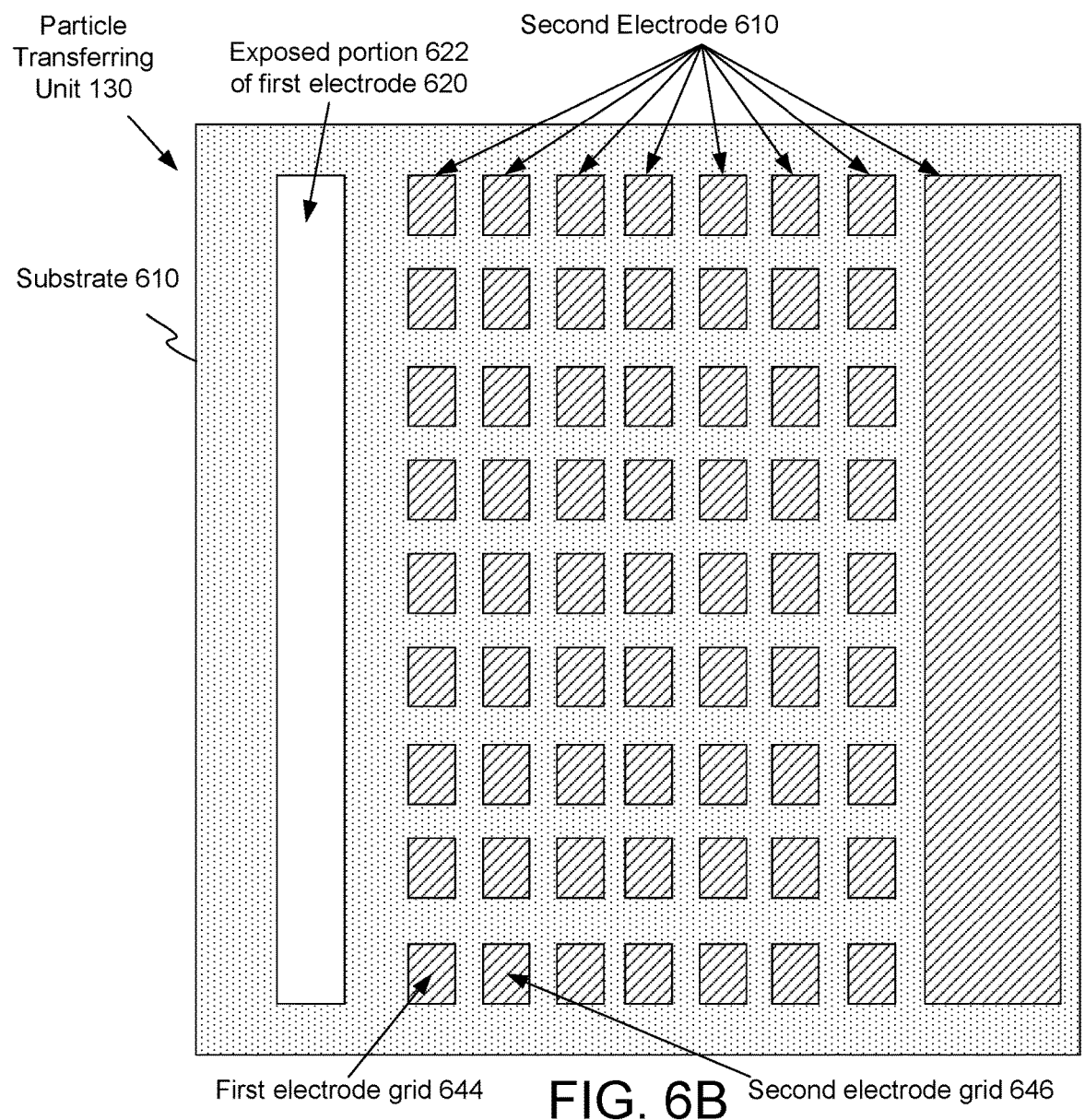
FIG. 6B illustrates a top view cross-section of a particle transferring unit that includes a first electrode and a second electrode, in accordance with implementations of the present disclosure.

FIG. 6B illustrates a top view cross-section of a particle transferring unit 130 that includes a first electrode 620 and a second electrode 640, in accordance with implementations of the present disclosure. FIG. 6B may illustrate a section view of the particle transferring unit 130 displayed in FIG. 6A as cut through horizontally through the second electrode 640.

FIG. 6B illustrates a cross-section of substrate 610, the exposed portion 622 of first electrode 620 (e.g., the non-exposed portion of the first electrode 620 and the dielectric layer 630 are not displayed (are under the section cut)), and the cross-section of the second electrode 640 (e.g., the layer of the substrate 610 that is disposed on the second electrode 640 is not displayed).

As described above, the first electrode 620 may be a continuous layer and the second electrode 640 may include a grid pattern including a first electrode grid 644 and a second electrode grid 646. The pitch of the electrode grids may be about 50 μm. The first electrode grid 644 may be powered independently from the second electrode grid 646 to modulate the electric field locally.

Figure 7A:
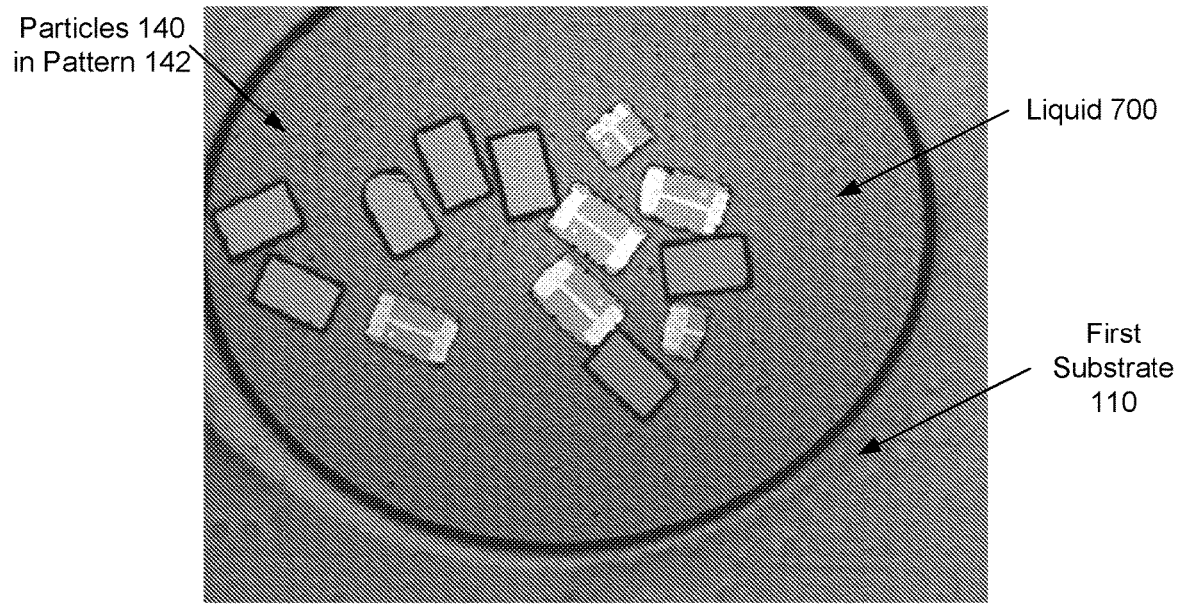
FIG. 7A illustrates particles in a pattern on a first substrate, in accordance with implementations of the present disclosure.

FIG. 7A illustrates particles 140 in a pattern 142 on a first substrate 110, in accordance with implementations of the present disclosure. In one implementation, FIG. 7A is an image taken from a bottom surface of the first substrate 110. The first substrate 110 may be transparent (e.g., a glass substrate) and the particles 140 are on a top surface of the first substrate 110.

In one implementation, the particles 140 may be chiplets (e.g., each chiplet may include one or more of a microprocessor, computer memory, electronic circuit, microelectromechanical systems (MEMS), sensors, etc.).

In one implementation, the particles may be in a liquid 700 (e.g., isoparaffinic fluid, synthetic isoparaffins, Isopar™ isoparaffinic fluids, etc.) on the first substrate 110.

The particle transferring unit 130 may remove the particles 140 in pattern 142 from the liquid 700 on first substrate 110. In one implementation, the particles 140 may be cleaned (e.g., remove liquid 700 from the particles 140) before being transferred to the second substrate 120.

Figure 7B:
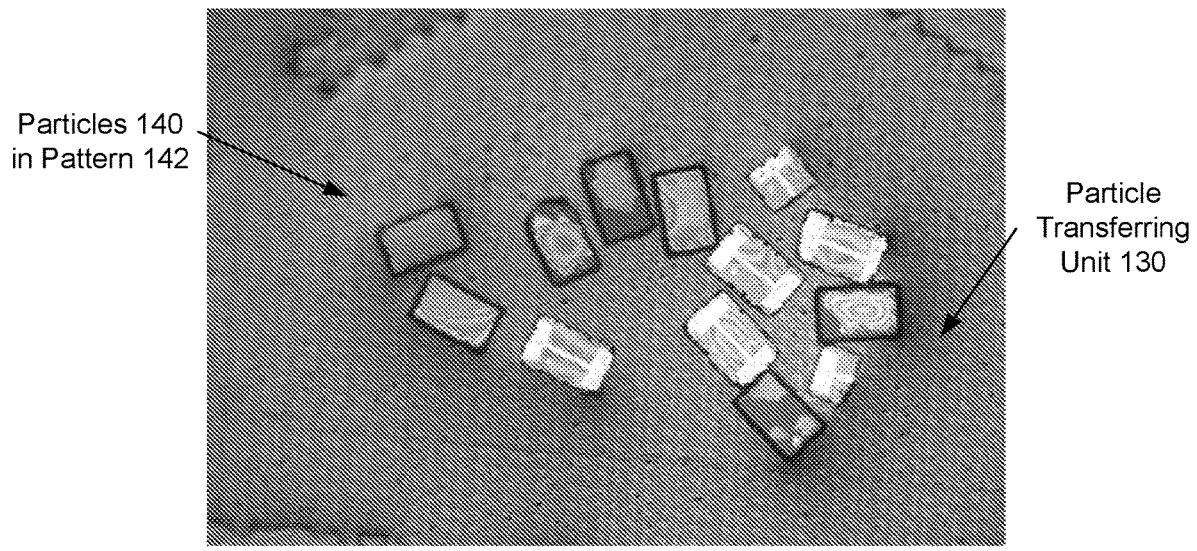
FIG. 7B illustrates the particles in the pattern on a particle transfer unit, in accordance with implementations of the present disclosure.

FIG. 7B illustrates the particles 140 in the pattern 142 on a particle transferring unit 130, in accordance with implementations of the present disclosure. In one implementation, FIG. 7B is an image taken of a bottom surface of the particle transfer unit 130. The particles 140 may be on the bottom surface of the particle transferring unit 130.

In one implementation, the particle transfer unit 130 picks up and transfers the particles 140 in the pattern 142 from the first substrate 110 and out of the liquid 700 (e.g., a liquid environment) to the second substrate 120. In one implementation, the second substrate 120 may be dry (e.g., in air or another gas, not in liquid). In one implementation, the second substrate may be in a liquid different than the liquid 700. In one implementation, the particles 140 may be transferred from a liquid environment (e.g., from on the first substrate 110) to a dry environment (e.g., to the second substrate 120 without any of liquid 700 so as to not contaminate the second substrate 120 with liquid 700). In one implementation, the particles 140 may be transferred from a first liquid environment (e.g., from on the first substrate 110) to a second liquid environment (e.g., to the second substrate 120 without any of liquid 700 so as to not contaminate the second substrate 120 with liquid 700).

The pattern 142 of the particles 140 on the particle transferring unit 130 (e.g., FIG. 7B) may be substantially the same as the pattern 142 of the particles 140 on first substrate 110 (e.g., FIG. 7A). In one implementation, the particles 140 are substantially the same distance from each other on the second substrate 120 as they were on the first substrate 110 (e.g., within 1 μm). In one implementation, the particles 140 are substantially the same relative distance from each other on the second substrate 120 as they were on the first substrate.

In one implementation, a 50-μm-electrode-grid substrate (e.g., particle transferring unit 130) is used to transfer about 200-um-by-200-um electrically charged silicon chips from a liquid environment (Isopar™, an Isopar™ bath, etc.). A signal may be applied to the particle transferring unit 130 and the applied signal may be a square wave with a 250-Volt peak-peak amplitude at 1-kilohertz to provide an electrical force can pick up the particles 140 from out of a liquid environment and keep the pattern fidelity.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter.

Although implementations of the disclosure were discussed in the context of transferring particles 140 in a pattern 142, one or more of the components or materials described herein may be utilized in other transfer systems. Thus, implementations of the disclosure are not limited to particles 140 in a pattern 142.

In the foregoing description, numerous details were set forth. It will be apparent, however, to one of ordinary skill in the art having the benefit of this disclosure, that the implementations of the present disclosure may be practiced without these specific details. In some instances, certain structures and devices are shown in block diagram form, rather than in detail, in order to avoid obscuring the present disclosure. It is to be understood that the details of such structures and devices, as well as various processes for producing the same, would be within the purview of one of ordinary skill in the art.

The terms "above," "under," "between," and "on" as used herein refer to a relative position of one layer with respect to other layers. As such, for example, one layer deposited or disposed above or under another layer may be directly in contact with the other layer or may have one or more intervening layers. Moreover, one layer deposited or disposed between layers may be directly in contact with the layers or may have one or more intervening layers. In contrast, a first layer "on" or deposited "onto" a second layer is in contact with that second layer. Additionally, the relative position of one layer with respect to other layers is provided assuming the initial disk is a starting substrate and the subsequent processing deposits, modifies and removes films from the substrate without consideration of the absolute orientation of the substrate. Thus, a film that is deposited on both sides of a substrate is "over" both sides of the substrate.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

The present disclosure is not to be limited in scope by the specific implementations described herein. Indeed, other various implementations of and modifications to the present disclosure pertaining to laser devices, in addition to those described herein, will be apparent to those of ordinary skill in the art from the preceding description and accompanying drawings. Thus, such other implementations and modifications pertaining to laser devices are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein, along with the full scope of equivalents to which such claims are entitled.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A particle-transferring system comprising:
   a first substrate comprising a first surface configured to support a plurality of particles in a non-uniform pattern;
   a particle transfer unit comprising a transfer substrate having an outer surface configured to be offset from the first surface by a first gap, wherein the particle transfer unit is configured to remove the plurality of particles from the first surface in response to the plurality of particles being within the first gap; and
   a second substrate comprising a second surface configured to be offset from the outer surface of the transfer substrate by a second gap, wherein the second substrate is configured to remove the plurality of particles from the particle transfer unit and secure the plurality of particles to the second surface in response to the plurality of particles being within the second gap; and
   one or more spacers attached to the particle transfer unit and configured to provide the first gap between the first substrate and the transfer substrate and provide the second gap between the second substrate and the transfer substrate,
   wherein the particle transfer unit is configured to transfer the plurality of particles and maintain the non-uniform pattern regardless of positions of the plurality of particles, which are not predefined to fit features of the particle transfer unit.

2. The particle-transferring system of claim 1, wherein the particle transfer unit is to remove the plurality of particles from the first surface via an electrical force generated by the particle transfer unit.

3. The particle-transferring system of claim 1, wherein the first substrate is to support the plurality of particles in a liquid.

4. The particle-transferring system of claim 1, wherein the transfer substrate is coupled to one or more flexible joints to position the transfer substrate to remove the plurality of particles from the first substrate and transfer the plurality of particles to the second substrate.

5. The particle-transferring system of claim 1, wherein the transfer substrate is flexible and coupled to one or more rollers, wherein the transfer substrate is rotated over the rollers to remove the plurality of particles from the first substrate and transport the plurality of particles to the second substrate.

6. The particle-transferring system of claim 1, wherein:
   the transfer substrate is a rigid curved substrate comprising an axis; and
   the transfer substrate is rotated about the axis to remove the plurality of particles from the first substrate and transport the plurality of particles to the second substrate.

7. The particle-transferring system of claim 1, wherein:
   the second surface is tacky; and
   the second substrate is configured to remove the plurality of particles from the particle transfer unit and secure the plurality of particles to the second surface in response to the plurality of particles contacting the second surface.

8. The particle-transferring system of claim 1, wherein:
   the plurality of particles form an assembled object comprising a plurality of rows disposed on the first substrate; and
   the particle transferring unit is to transfer the assembled object by, for each of the plurality of rows, removing a row of the plurality of rows from the first substrate and transferring the row to the second substrate.

9. The particle-transferring system of claim 1, wherein the particle transfer unit is to transfer the plurality of particles to the second substrate to form a functional assembly.

* * * * *